United States Patent [19]
Arai et al.

[11] Patent Number: 5,644,146
[45] Date of Patent: Jul. 1, 1997

[54] THIN FILM TRANSISTOR

[75] Inventors: Michio Arai, Tokyo; Mitsufumi Codama; Ichiro Takayama, both of Kanagawa, all of Japan

[73] Assignees: TDK Corporation, Tokyo; Semiconductor Energy Laboratory Co., Ltd., Kanagawa, both of Japan

[21] Appl. No.: 407,856

[22] Filed: Mar. 21, 1995

[30] Foreign Application Priority Data

Mar. 23, 1994 [JP] Japan .................... 6-051681

[51] Int. Cl.$^6$ .................... H01L 27/01; H01L 29/78
[52] U.S. Cl. .................... 257/66; 257/37; 257/64; 257/287; 257/317; 257/365; 257/366
[58] Field of Search .................... 257/36–39, 64, 257/66, 67, 61, 287, 316, 317, 350, 354, 359, 365, 366

[56] References Cited

U.S. PATENT DOCUMENTS

| | | | |
|---|---|---|---|
| 5,308,998 | 5/1994 | Yamazaki et al. | 252/66 |
| 5,329,140 | 7/1994 | Sera | 257/66 |
| 5,420,048 | 5/1995 | Kondo | 257/66 |
| 5,434,127 | 7/1995 | Nakamura et al. | 257/66 |
| 5,475,238 | 12/1995 | Hamada | 257/66 |

FOREIGN PATENT DOCUMENTS

| | | | |
|---|---|---|---|
| 60-58676 | 4/1985 | Japan . | |
| 0343689 | 12/1993 | Japan | 257/66 |

OTHER PUBLICATIONS

"Characteristics of Op Amps Using Polycrystalline Silicon thin Film Transistors", Nakamura et al, Institute of Electronics, Information and Communication of Japan, Autumn General Meeting 1990, C-549.

*Primary Examiner*—Sara W. Crane
*Assistant Examiner*—Alexander Oscar Williams
*Attorney, Agent, or Firm*—Nikaido Marmelstein Murray & Oram LLP

[57] ABSTRACT

A thin film transistor comprises a dielectric substrate (1), a semiconductor layer (3) of poly-crystalline silicon layer having a drain region (8), an active gate region (4, 8–0), and a source region (7) placed on said substrate (1), a drain terminal (10) and a source terminal (10A) connected to said respective regions for external connection, a gate electrode (6) coupled with a part of said gate region (4) through a dielectric layer (4A), wherein length (d) of said gate electrode (6) is shorter than the length of gate region (4 plus 8–0), so that an offset region (8–0), where no gate electrode faces with said gate region, is produced.

6 Claims, 10 Drawing Sheets

THIN FILM TRANSISTOR

BACKGROUND OF THE INVENTION

The present invention relates to a thin film transistor. In particular, it relates to such a thin film transistor with a poly-crystalline silicon layer, and still more particularly, it relates to such a transistor of a double gate type which is suitable for use in an amplifier.

A thin film transistor is conventionally used for a switching element for a liquid crystal display element. An amplifier which uses a thin film transistor is also described in "Characteristics of Op amps using polycrystalline silicon thin film transistors" a paper given at the Autumn conference No. C549 organized by the Institute of Electronics, Information, and Communication in Japan, in 1990.

In order to provide an amplifier having a thin film transistor with excellent yield rate production and excellent operational characteristics, the curve showing the relationship between drain voltage ($V_D$) and drain current ($I_D$) of a transistor must have a preferable relationship. In other words, the drain current ($I_D$) is preferably constant irrespective of changes in the drain voltage ($V_D$). That characteristic was conventionally obtained by using a pentode vacuum tube.

However, a prior thin film transistor has $V_D$ to $I_D$ characteristics as shown in the curve (A) in FIG. 10, in which the drain current $I_D$ increases when the drain voltage $V_D$ exceeds a predetermined value because of an avalanche effect. That predetermined value is for instance around 8 V. The avalanche effect appears in particular when a transistor is produced in a poly-crystalline silicon layer, as compared with what happens when the transistor is produced in a single crystal silicon layer. Those characteristic are not preferable as an amplifier.

Another requirement for a thin film transistor for use in an amplifier is that threshold voltage, which is defined as gate voltage to turn ON or turn OFF a transistor, is controllable, for obtaining excellent amplification.

However, the control of the threshold voltage of a thin film transistor is conventionally impossible.

SUMMARY OF THE INVENTION

The object of the present invention is to overcome the disadvantages and limitations of prior thin film transistors by providing a novel and improved thin film transistor.

It is also an object of the present invention to provide a thin film transistor which has no avalanche effect.

It is also an object of the present invention to provide a thin film transistor in which the threshold voltage is adjustable.

The above and other objects are attained by a thin film transistor comprising: a dielectric substrate; a semiconductor layer having: a drain region, an active gate region, and a source region, placed on said substrate; a drain terminal connected to said drain region and a source terminal connected to said source region both for external connection; and a gate electrode coupled with only a part of said gate region through a dielectric layer; wherein length of said gate electrode along said gate region is shorter than the length of said gate region so that an offset region is provided wherein no gate electrode faces said gate region.

DESCRIPTION OF THE PREFERRED EMBODIMENTS

The embodiments of the present invention are now described in accordance with the drawings.

Figure 1A:
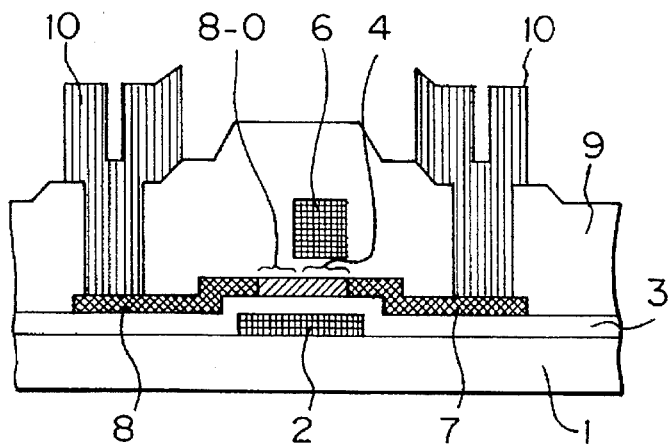
FIGS. 1(A), 1(B) and 1(C) show the structure of a thin film transistor according to the present invention.
Figure 1B:
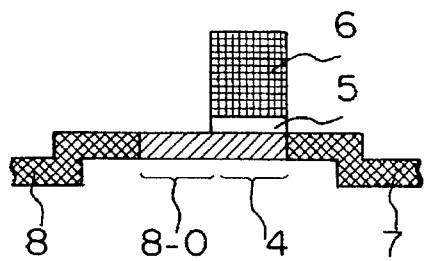
Figure 1C:
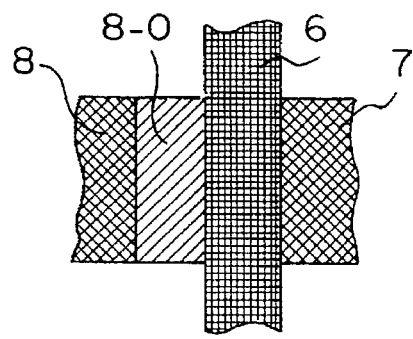

FIG. 1 shows cross section of a thin film transistor according to the present invention, in which FIG. 1(A) is a cross section of a thin film transistor, Fig 1(B) is an enlarged view of a part of the thin film transistor of FIG. 1(A) adjacent to a gate electrode, and FIG. 1(C) is a plane view of part of the transistor of FIG. 1(B). FIGS. 2 through 5 show steps for producing a thin film transistor according to the present invention, and FIG. 6 shows operational characteristic curves of thin film transistors according to the present invention.

In FIG. 1, the numeral 1 designates a dielectric substrate which is for instance a Si single crystal substrate, 2 is a rear gate electrode, 3 is a rear gate insulation layer, 4 is a gate region, 5 is a front gate insulation layer, 6 is a front gate electrode, 7 is a source region, 8 is a drain region, 8-0 is an offset region, 9 is an interlayer insulation layer, and 10 and 10A are terminals for external connection. The source region 7, the gate region, the offset region 8-0 and the drain region 8 are produced in a semiconductor layer which is preferably a polycrystalline silicon layer.

The presence of an offset region 8-0 where no gate electrode 6 exists facing against a semiconductor layer is the feature of the present invention.

The offset region 8-0 is preferably provided adjacent to a drain region 8.

The length (d) of the offset region 8-0 between the end of the gate electrode 6 and the end of the drain region 8 (see FIG. 1(C)) is preferably in the range between 5000 Å and 1.5 µm, in order to avoid an avalanche effect and to provide a desired threshold voltage. If the length (d) is shorter than 5000 Å, the effect for overcoming the avalanche effect is insufficient.

The substrate is not restricted to a Si single crystal substrate, but a glass substrate may be used.

The producing steps of the present thin film transistor are described in accordance with FIGS. 2–5.

Figure 2A:
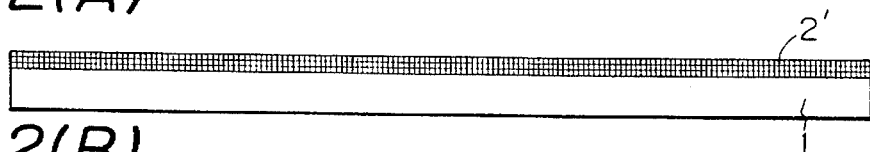
FIGS. 2(A)–2(G), FIGS. 3(A)–3(D), FIGS. 4(A)–4(C) and FIGS. 5(A)–5(C) show steps for producing a thin film transistor according to the present invention.

(1) First, an insulation substrate 1 of silicon (Si) is put in place, and a poly-crystalline silicon layer 2', which is poly-crystalline silicon layer doped with P (phosphorus), is deposited on said substrate 1, in a thickness of approximate 1000 Å (Angstrom) (FIG. 2(A)).

The process conditions for producing said layer are:

| SiH₄ gas | 10–40 SCCM (Standard Cubic Centimeter per Minute) |
| 5% PH₃/H₂ gas | 5–20 SCCM |
| Pressure | 0.1–0.5 Torr |
| Temperature | 600–650° C. |

Figure 2B:
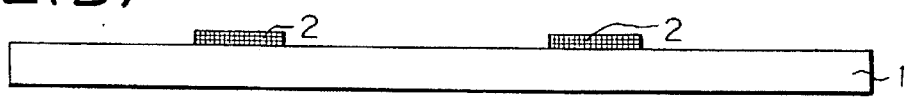
Figure 2C:
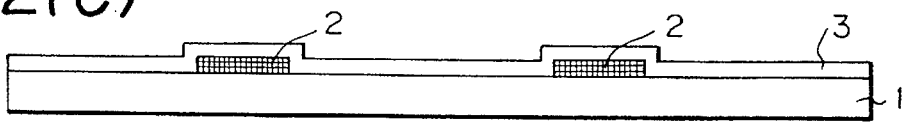
Figure 2D:
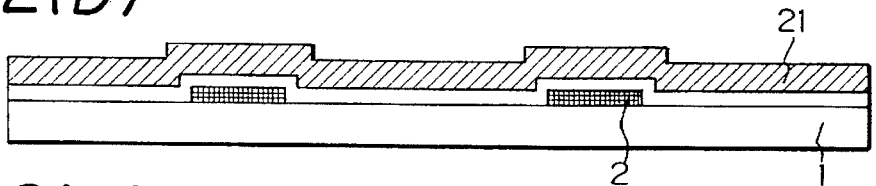

(2) Next, the poly-crystalline silicon layer 2', which is disposed on the substrate, is patterned to produce a rear gate electrode 2 (FIG. 2(B)).
(3) Then, a rear gate insulation layer 3, made of $SiO_2$, is deposited in a thickness of 100–1000 Å (FIG. 2(C)).
The process conditions for producing said layer 3 are:

| TEOS (tetraethoxy silane) gas | 10–50 SCCM |
| $O_2$ gas | 500 SCCM |
| Pressure | 0.1–1.0 Torr |
| Temperature | 750° C. |

(4) Then, an amorphous silicon layer 21 is deposited on said rear insulation layer 3 in a thickness of approximately 1500 Å. Said amorphous silicon layer is crystallized through a solid-state growth process (FIG. 2(D)).

The process conditions for producing said amorphous silicon layer are as follows.

| $Si_2H_6$ gas | 100–500 SCCM |
| He gas | 500 SCCM |
| Pressure | 0.5–1.0 Torr |
| Temperature | 750° C. |

The process conditions for annealing the solid-state growth are as follows.

| $N_2$ gas | 1 SLM (Standard Liter per Minute) |
| Temperature | 600° C. |
| Process time | 8–48 hours |

Figure 2E:
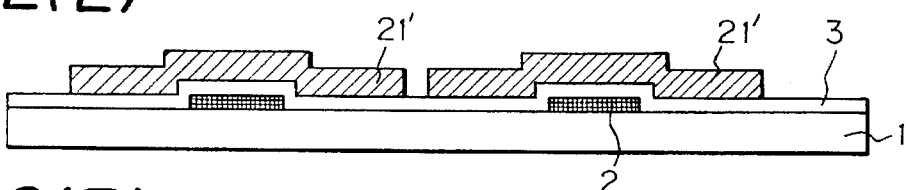
Figure 2F:
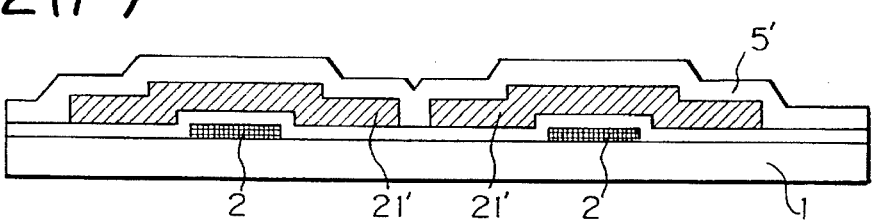
Figure 2G:
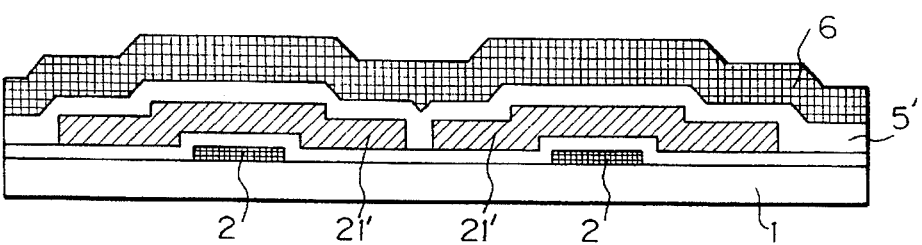

(5) The poly-crystalline silicon layer obtained in the above step (4) is patterned to provide active layers 21', of poly-crystalline silicon (FIG. 2(E)).
(6) On the poly-crystalline silicon layers 21', an insulation layer 5' of $SiO_2$ is deposited in a thickness of approximate 1000 Å, through a plasma CVD process (FIG. 2 (F)).
(7) Then, on said $SiO_2$ layer 5', an $n^+$ poly-crystalline silicon layer 6' is deposited in a thickness of approximate 2500 Å, through a plasma CVD process (FIG. 2 (G)). Said $n^+$ polysilicon layer 6' constitutes a front gate electrode.
(8) Next, an $SiO_2$ layer 22 is deposited on said $n^+$ poly-crystalline silicon layer 6' in a thickness of approximate 2000 Å, as a shield member (FIG. 3(A)).
(9) Said shield member 22 is subject to shape patterning to provide a front gate electrode through a photolithography process. For that purpose, a resist 23 is first deposited on the shield member 22 so that the portion where no resist is deposited is removed through an etching process which uses an etching agent of a fluorine acid group (FIG. 3(B)).
(10) Next, the etching process for the $n^+$ poly-crystalline silicon layer 6' is carried out through a dry etching process. In this process, the portion of the poly-crystalline silicon layer 6' under the shield member 22 is etched, so that an arm 22a is left in an overhanging condition. In other words, the arm 22a extends beyond the front gate electrode. The arm of the shield member 22 and the column of the polysilicon layer 6' are each T-shaped (FIG. 3(C)).

The length of the arm 22a of the shield member 22 is adjusted to provide the proper length of offset or LDD. The LDD is a Light Doped Drain which is a high resistance layer between the channel portion 4 and a drain region 7.

Figure 3A:
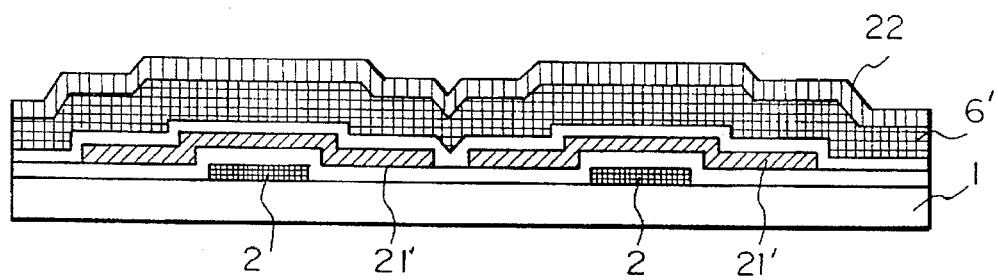
Figure 3B:
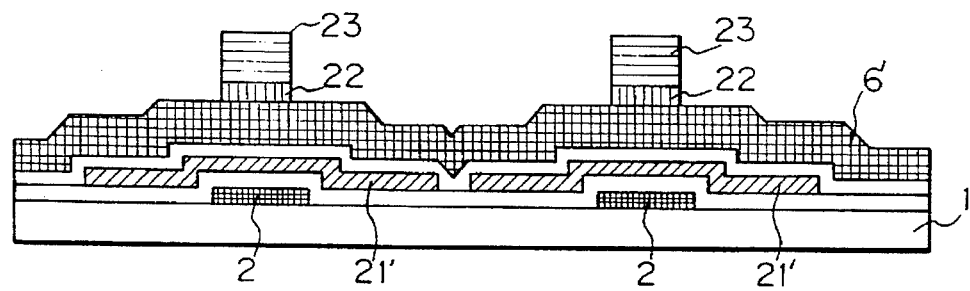
Figure 3C:
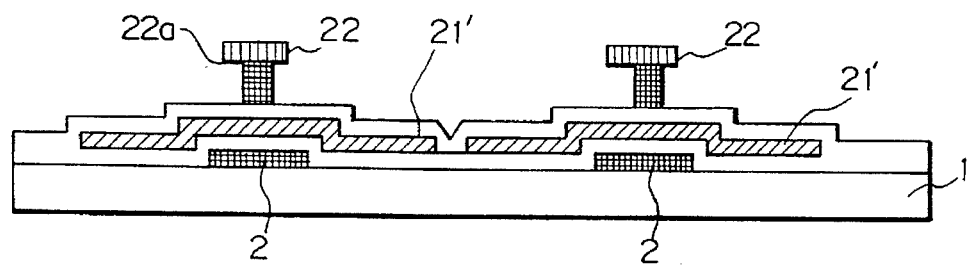
Figure 3D:
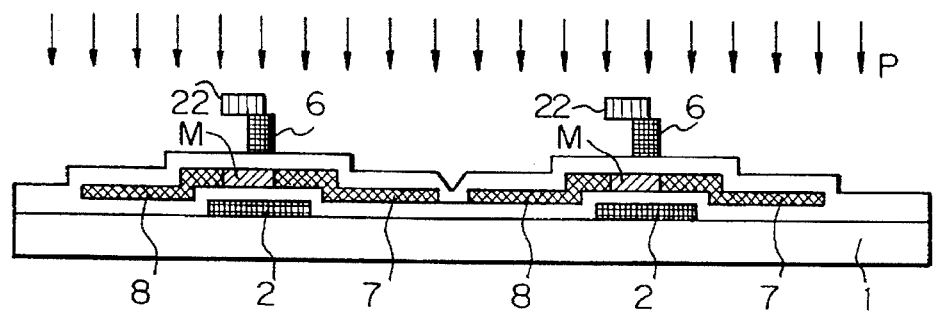

(11) Next, a portion of the arm 22a in the source region is removed through a photolithography process (FIG. 3(D)).

Then, phosphorous (P), in atomic density of $1 \times 10^{15}$ atoms/cm² is ion injected into the poly-crystalline silicon layer, except not into the portion M which is masked by the column 6, which is not removed in said etching process, and the arm 22a. Thus, an n-type source region 7 and an n-type drain region 8 are obtained (FIG. 3 (D)).

(12) Next, the n-type portion is masked with a resist 24, and the portion which is not masked is ion-injected with boron (B) in a density of $5 \times 10^{15}$ atoms/cm². Thus, a p-type portion is obtained (FIG. 4(A)).

Figure 4A:
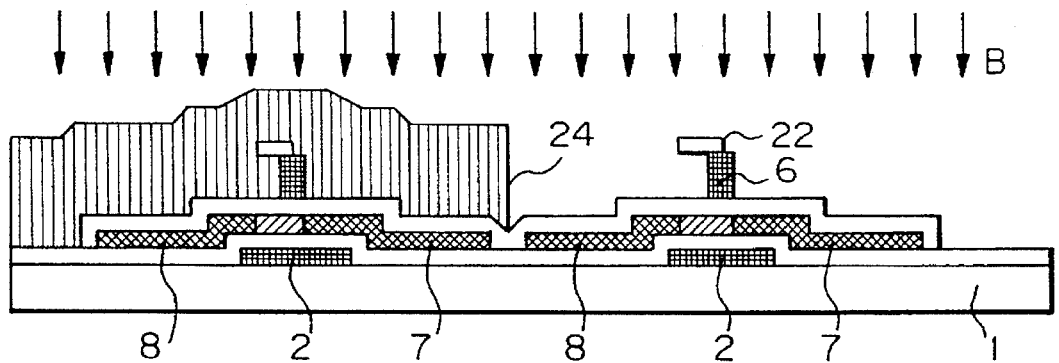
Figure 4B:
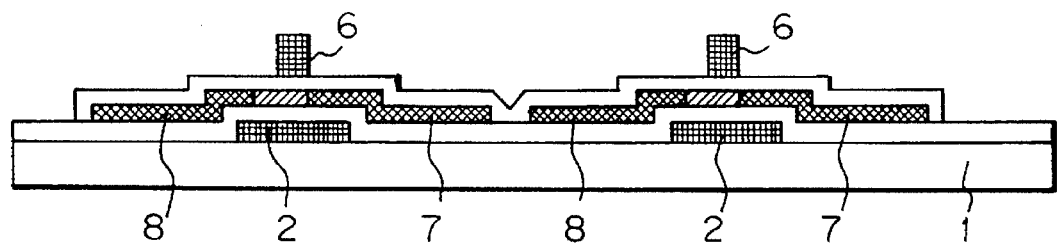

(13) Then, the resist 24 and the shield member 22 are removed, so that a structure is obtained which is offset in the drain region only (FIG. 4(B)). The structure is activated at a temperature of 500° C. for 12 hours.

Figure 4C:
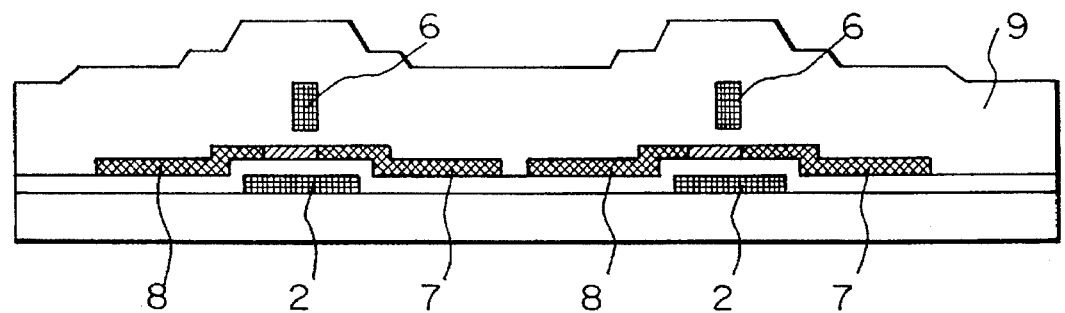

(14) An inter-layer insulation layer 9 of phosphorus glass is then produced on the structure through a normal pressure CVD process (FIG. 4(C)).

Figure 5A:
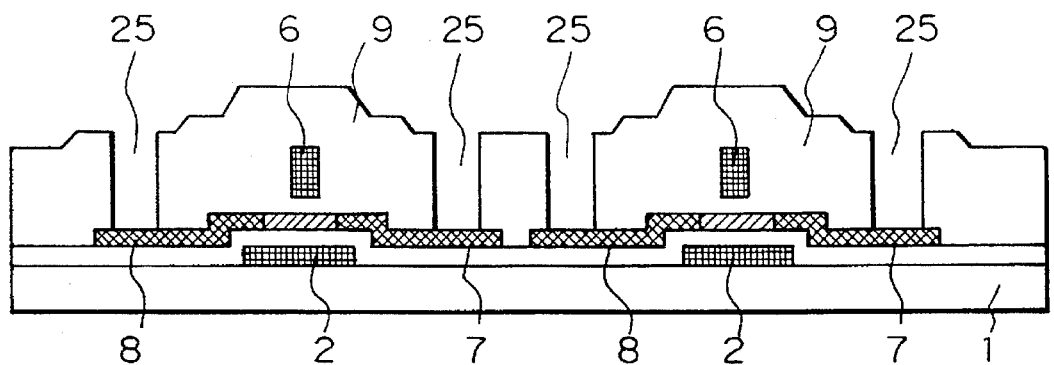
Figure 6:
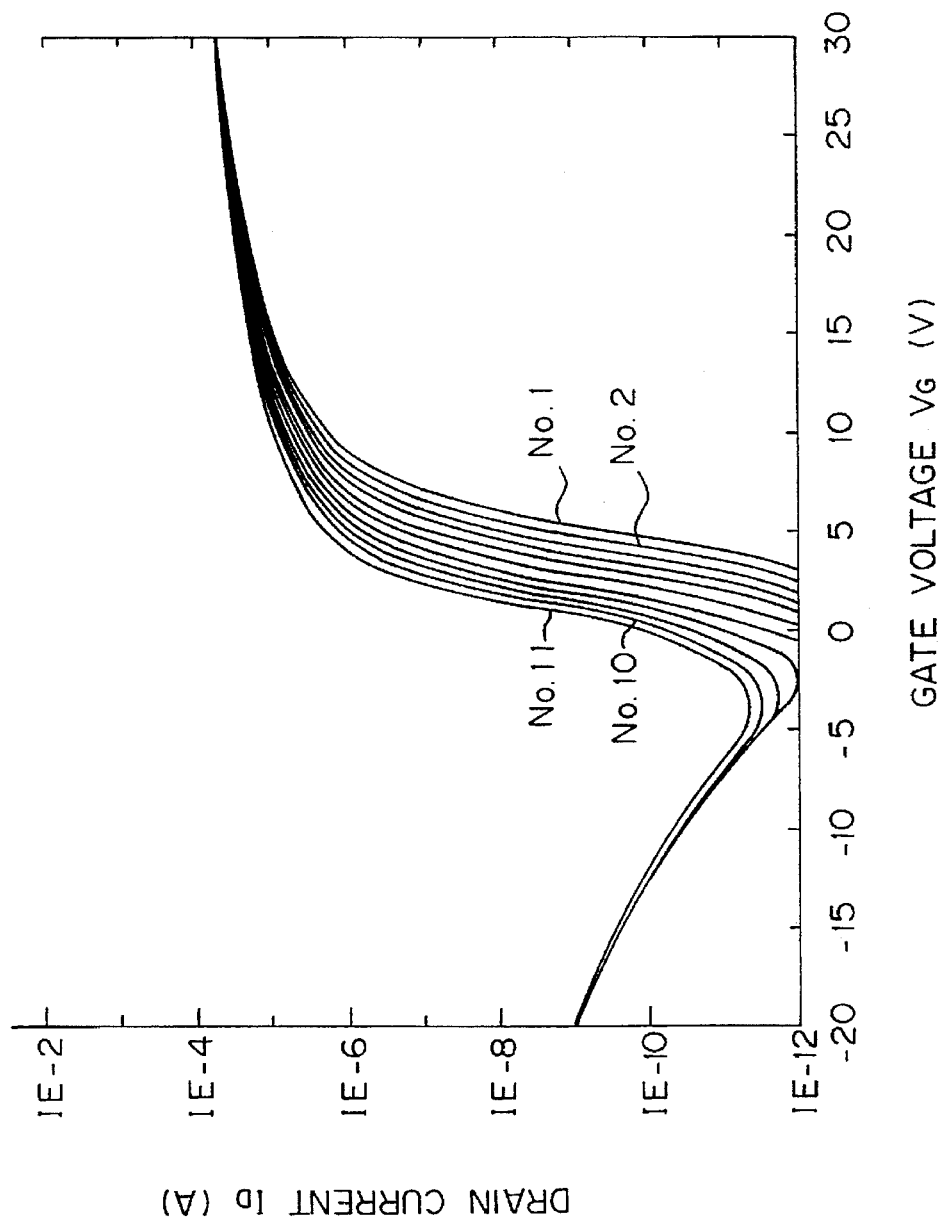
FIGS. 6 and 7 show operational characteristics of thin film transistors according to the present invention.

(15) Some contact holes 25 are provided penetrating said inter-layer insulation layer 9 (FIG. 5(A)).

Figure 5B:
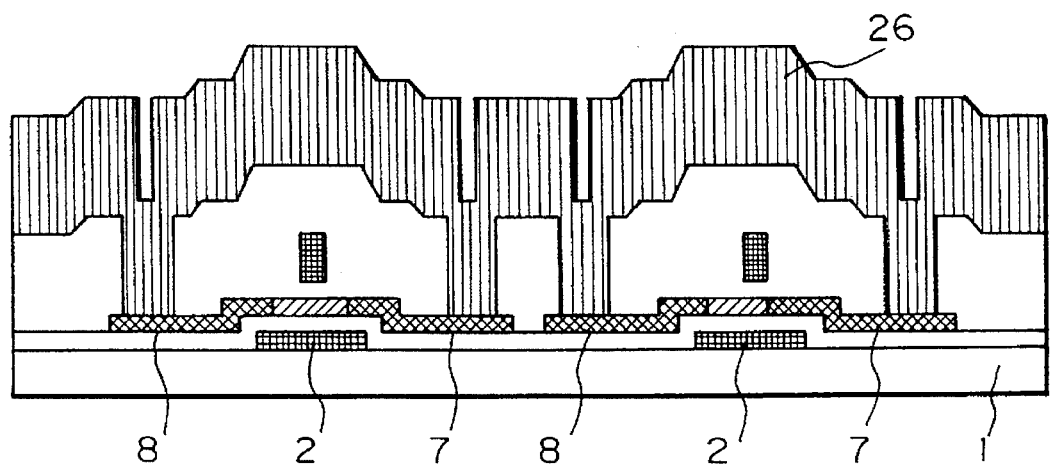

(16) A conductive layer 26 of aluminum is sputtered on the insulation layer 9 (FIG. 5(B)).

Figure 5C:
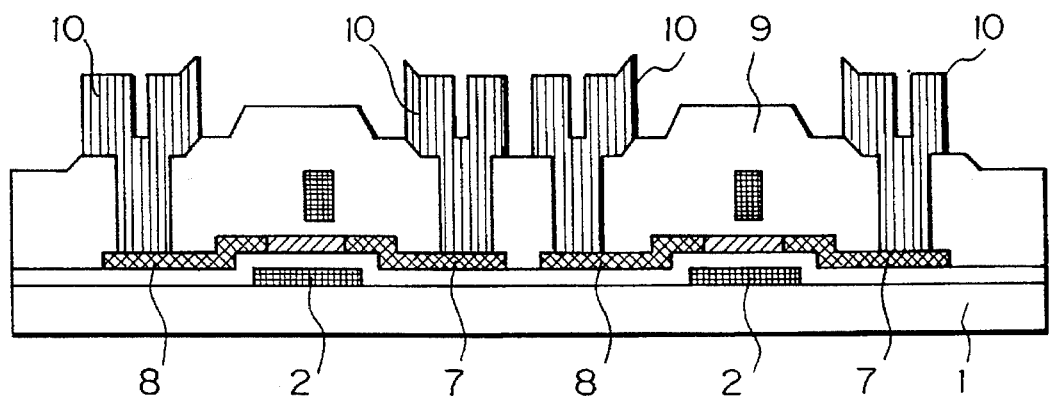

(17) Terminals 10 with desired shape for external connection are obtained through patterning operation of said conductive layer 26 (FIG. 5(C)).

In the above explanation, it should be appreciated that the dimension of each members in the figures, for instance, the $SiO_2$ layer 5', the $n^+$ poly-crystalline silicon layer 6', and the active layer 21', are merely illustrative, but do not coincide with that of actual products.

Now, the operational characteristics of the thin film transistor according to the present invention are described.

FIG. 6 shows curves relating the voltage ($V_G$) on the front gate (upper gate) on the horizontal axis (volt) and the drain current ($I_D$) on the vertical axis (ampere) of an N-channel thin film transistor of a double gate type. The scale IE-n on the vertical axis is in units of $10^{-n}$. Therefore, IE-2 means $10^{-2}$ ampere. In FIG. 6, tests are reported for the samples Nos. 1 through 11 show the parameter of lower gate (rear gate) voltage. In those samples, sample No. 1 has a rear gate voltage of −5 V, and sample No. 2 has a rear gate voltage of −4 V. The rear gate voltage is then shifted by 1 volt for each sample. Therefore, sample No. 6 has 0 V, sample No. 10 has +4 V, and sample No. 11 has +5 V.

It should be appreciated from the data in FIG. 6 that the curves are almost linear when the front gate voltage (upper gate voltage) is higher than 10 volts.

The data in Table 1 show the relations between the rear gate voltage and the threshold voltage in an N-channel thin film transistor according to the present invention.

It should be appreciated from the data in Table 1, that the control of threshold voltage is possible in the present thin film transistor by adjusting the voltage on the rear gate.

TABLE 1

| Sample No. | Rear gage Voltage (V) | Threshold Voltage (V) |
| --- | --- | --- |
| 1 | −5 | 5.883 |
| 2 | −4 | 5.208 |
| 3 | −3 | 4.728 |

TABLE 1-continued

| Sample No. | Rear gage Voltage (V) | Threshold Voltage (V) |
|---|---|---|
| 4 | −2 | 4.209 |
| 5 | −1 | 3.891 |
| 6 | 0 | 3.509 |
| 7 | +1 | 3.031 |
| 8 | +2 | 2.559 |
| 9 | +3 | 2.117 |
| 10 | +4 | 1.591 |
| 11 | +5 | 0.951 |

Figure 7:
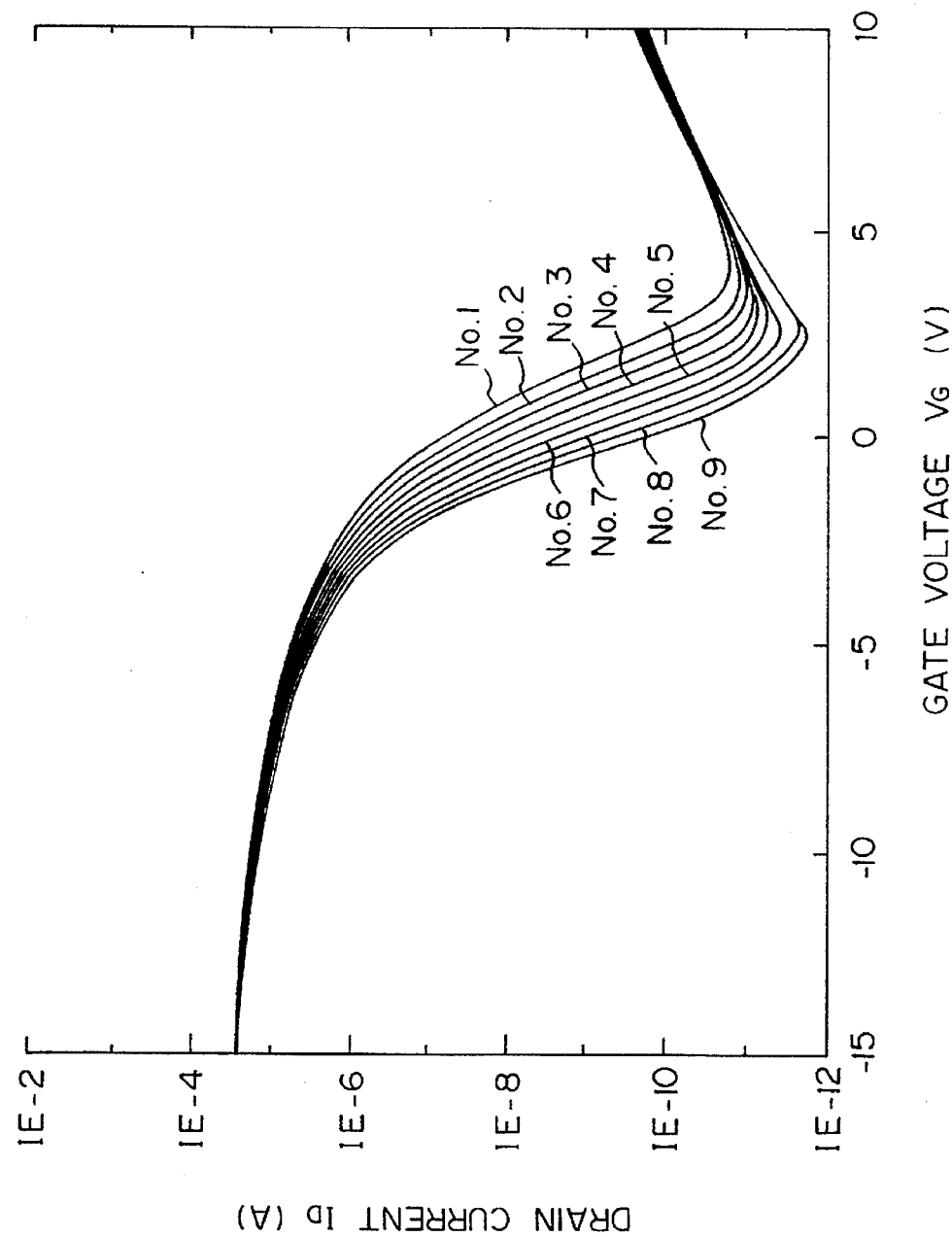

FIG. 7 shows similar curves to those of FIG. 6, but for a P-channel thin film transistor according to the present invention. In FIG. 7, the horizontal axis shows front gate voltages in volts ($V_G$) and the vertical axis shows drain currents in amperes ($I_D$). The scale IE-n of the vertical axis is in units of $10^{-n}$ as in FIG. 6. The parameter in FIG. 7 is a rear gate voltage as in the case of FIG. 6, and it should be noted that almost linear characteristics are obtained when the front gate voltage is lower than −5 V (the absolute value of front gate voltage is higher than 5 V).

The Table 2 shows the relationship between the rear gate voltage and the threshold voltage in a P-channel thin film transistor according to the present invention.

It should be appreciated from the data in Table 2 that the control of threshold voltage is possible in the present thin film transistor by adjusting the voltage on a rear gate.

TABLE 2

| Sample No. | Rear gage Voltage (V) | Threshold Voltage (V) |
|---|---|---|
| 1 | 4 | −4.975 |
| 2 | 3 | −4.562 |
| 3 | 2 | −4.156 |
| 4 | 1 | −3.802 |
| 5 | 0 | −3.411 |
| 6 | −1 | −3.006 |
| 7 | −2 | −2.642 |
| 8 | −3 | −2.325 |
| 9 | −4 | −1.875 |

Figure 8:
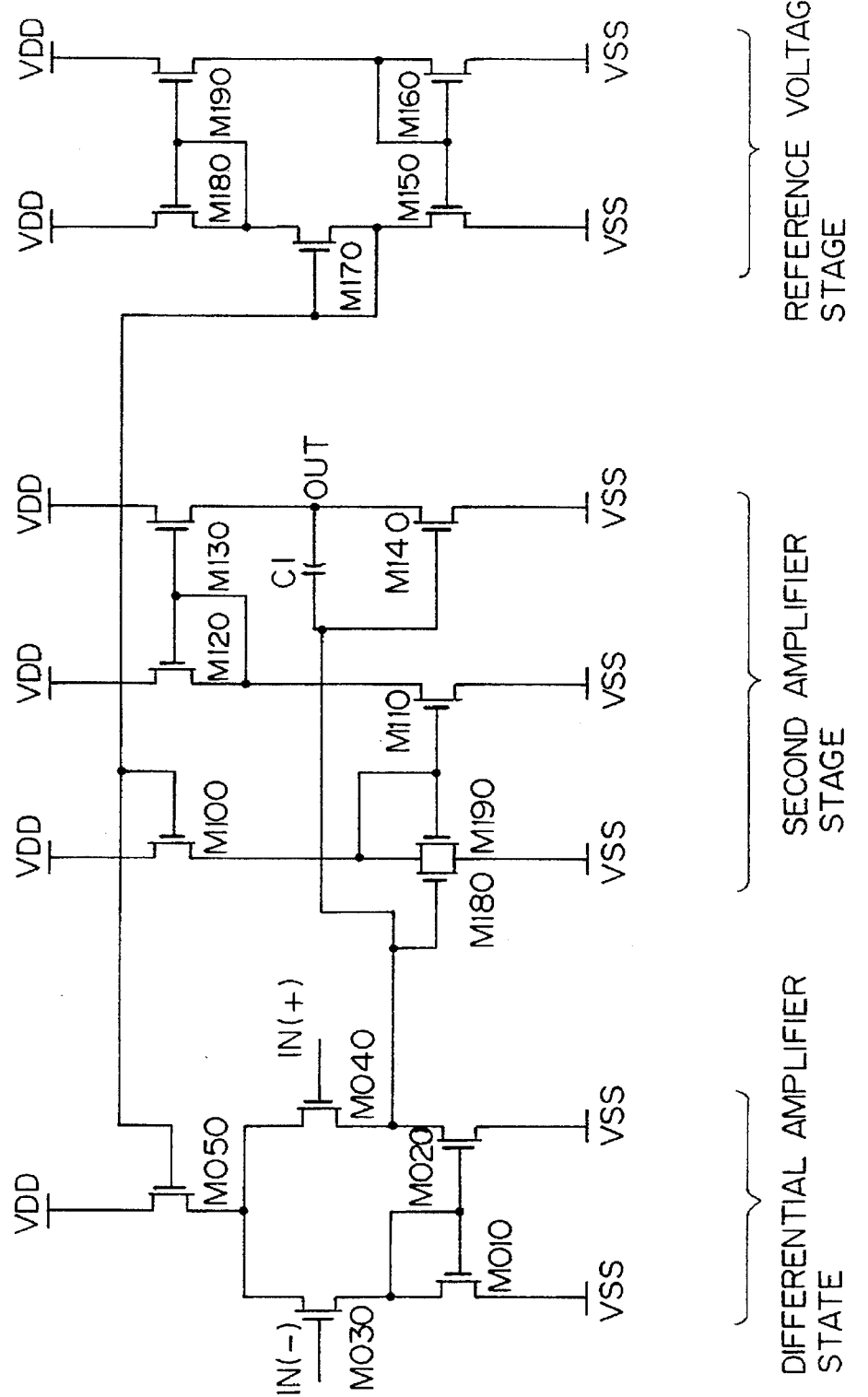
FIG. 8 shows a circuit diagram of an amplifier which uses a thin film transistor according to the present invention.

FIG. 8 shows a circuit diagram of an amplifier using thin film transistors according to the present invention. The amplifier has a differential amplifier stage, a second amplifier stage, and a reference voltage stage. An input signal IN(−) and IN(+) is applied to the reference amplifier stage, and an output signal OUT is obtained in the second amplifier stage. The symbols VDD and VSS show drain voltage source and source voltage source, respectively. A symbol of a gate of a thin film transistor in FIG. 8 shows an upper gate, and a lower gate which is biased to a predetermined potential, which is not shown.

The amplifier in FIG. 8 according to the present invention has the advantage that the semiconductor elements are deposited on an insulating substrate, on which a sensor element or a liquid crystal device is deposited. A sensor is, for instance, an optical-electrical sensor which converts optical energy to electrical energy. Since a sensor, which provides a very small output signal, and an amplifier are deposited on the same substrate, a sensor-amplifier assembly is obtained which operates without being affected by external noise.

Figure 9B:
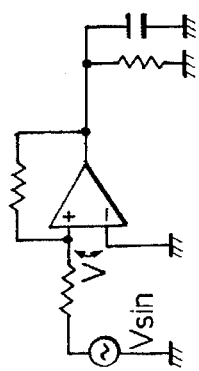
FIGS. 9(A) and 9(B) show operational characteristic curves of an amplifier which uses a thin film transistor according to the present invention.
Figure 9A:
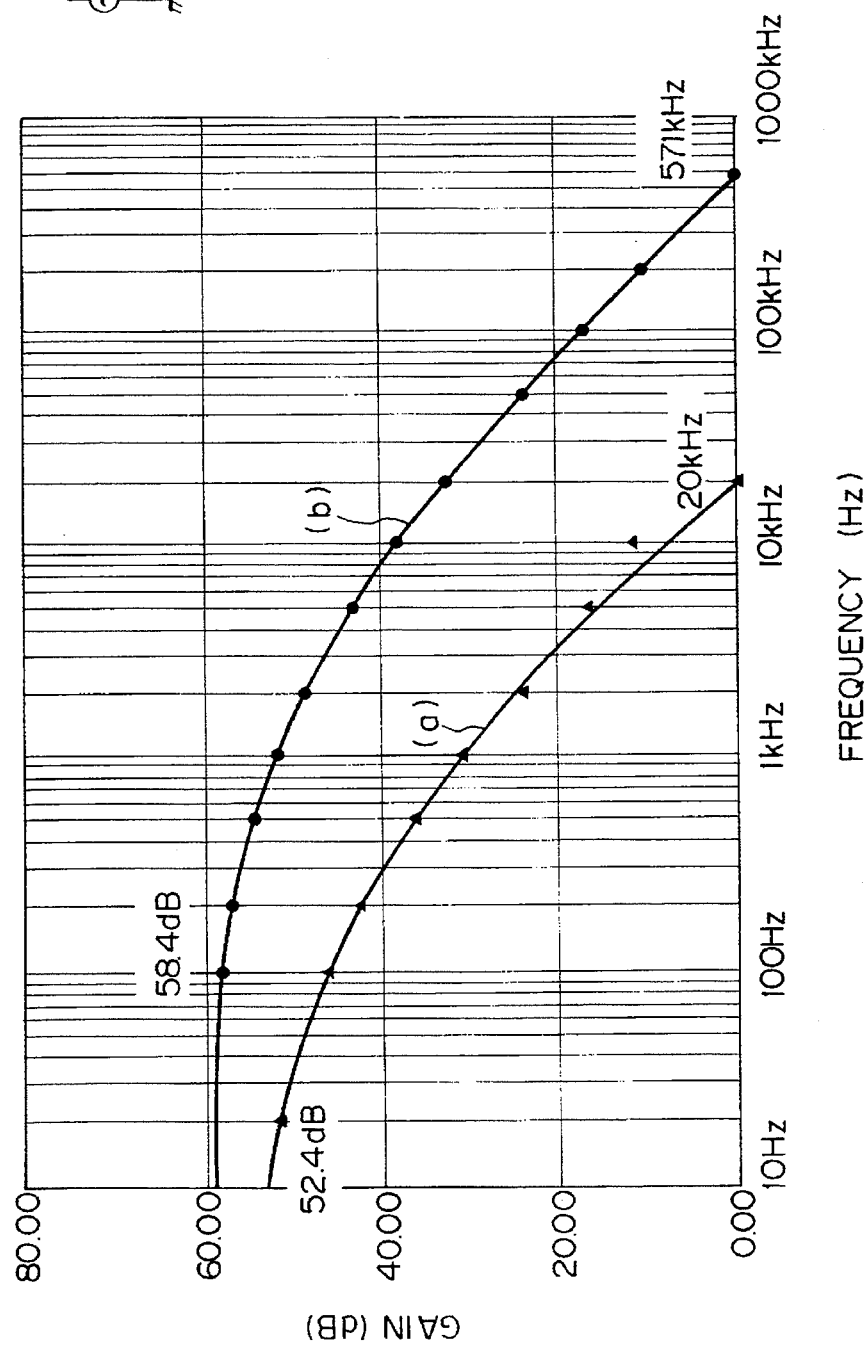

FIG. 9(A) shows curves of frequency characteristics of an amplifier circuit which is shown in FIG. 9(B). The horizontal axis is frequency in Hz, and the vertical axis is open voltage gain in dB. A load on the amplifier is a parallel circuit of a resistor of 10 MΩ and a capacitor of 10 pF. The curve (a) shows the case where the source voltage is ±2 V, and the curve (b) shows the case where the source voltage is ±5 V.

Figure 10:
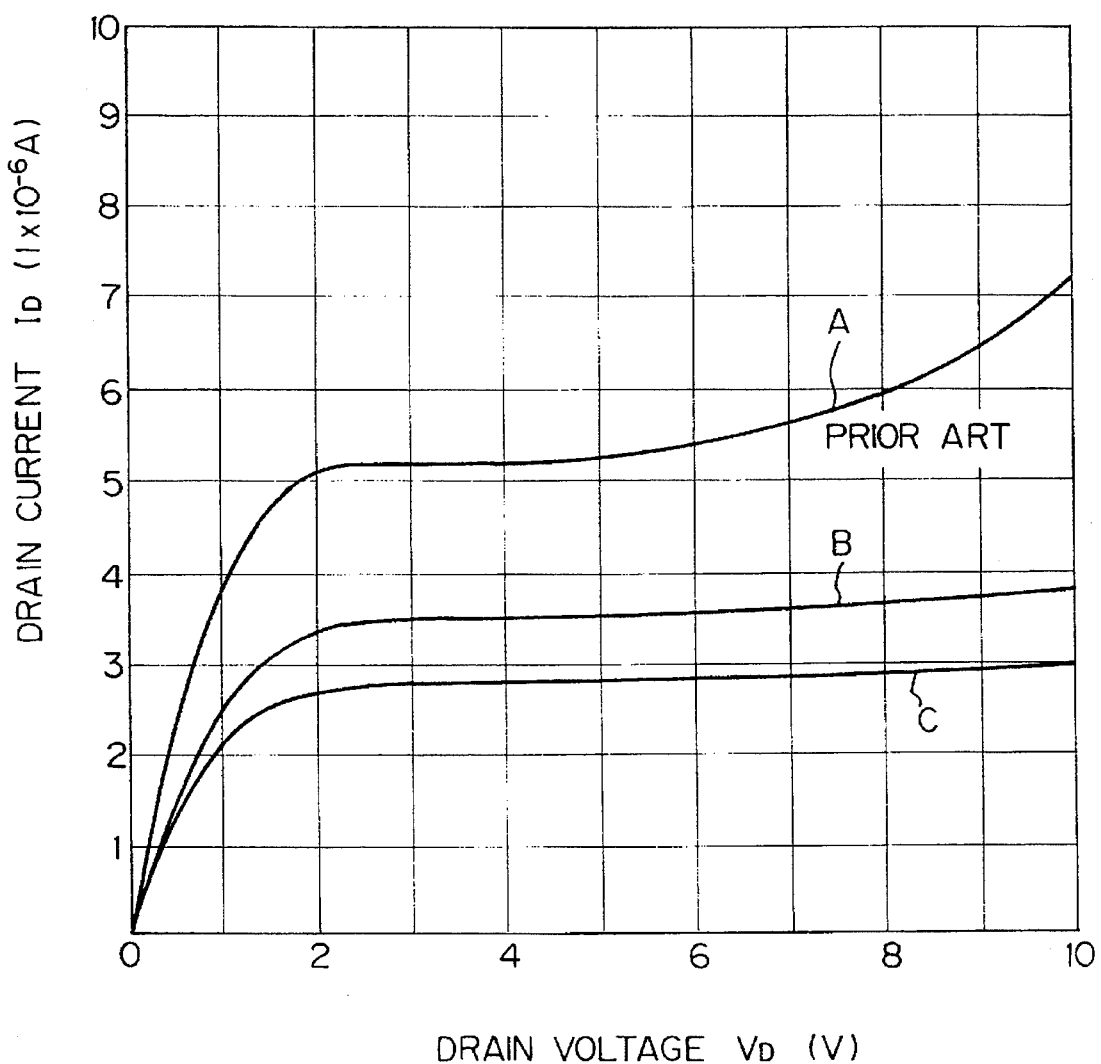
FIG. 10 shows curves relating drain voltage and drain current of a thin film transistor according to the present invention, and that of the prior art.

FIG. 10 shows curves relating drain voltage ($V_D$) and drain current ($I_D$) of a thin film transistor of the prior art and the present invention.

The curve (A) shows the characteristics of a prior thin film transistor which has no offset structure. It should be noted that the drain current increases non-linearly when the drain voltage is high because of an avalanche effect.

The curve (B) shows the characteristics of the present thin film transistor which has an offset structure to one side of the gate electrode, for instance adjacent to a drain region. It should be noted that the drain current is almost constant and linear even when the drain voltage is high.

The curve (C) shows the characteristics of the present thin film transistor which has offset structures on both sides (on the side of a drain region and the side of a source region) of a gate electrode. The curve is substantially linear and constant, but the mobility decreases undesirably.

As described above, the offset structure is effective to provide linear relations between drain voltage and drain current, and a one side offset structure, preferably adjacent to a drain region, is preferable in consideration of mobility.

As mentioned above in detail, the present invention provides a thin film transistor which provides substantially linear or constant drain current in relation to drain voltage. That characteristic is effective to provide an excellent amplifier.

Said offset structure is preferably provided on one side, for instance on the drain region side.

The present invention is applicable not only to a conventional FET which has a single gate, but also to a double gate type thin film transistor. In that case, the adjustment of threshold voltage is possible by adjusting the voltage on the lower gate.

From the foregoing, it will now be apparent that a new and improved thin film transistor has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A thin film transistor comprising;
    a dielectric substrate,
    a semiconductor layer, comprising polycrystalline silicon, having a drain region, an active gate region, and a source region, disposed on said substrate,
    a drain terminal connected to said drain region, and a source terminal connected to said source region, both for external connection,
    a first gate electrode asymmetrically positioned with respect to and coupled with a part of said active gate region through a dielectric layer,
    wherein the length of said gate electrode proximate to said active gate region is shorter than the length of said active gate region juxtaposed thereto whereby forming an offset region of said active gate region which is not juxtaposed to said gate electrode; and
    wherein said offset region is provided in the portion of said active gate region directed toward said drain region, and no offset region is provided in the portion of said active gate region directed toward said source region; and
    a second gate electrode disposed on the side of said active gate region opposite to said first gate electrode, wherein the length of said second gate electrode is substantially the same as the length of said active gate region.

2. A thin film transistor according to claim 1, wherein length of said offset region proximate to said active gate region is longer than 5000 Å.

3. A thin film transistor according to claim 1, wherein length of said offset region proximate to said active gate region is shorter than 1.5 µm.

4. A thin film transistor according to claim 1 wherein said asymmetrically positioned gate electrode does not extend beyond an end of said active gate region directed toward said drain region.

5. A thin film transistor comprising;

a dielectric substrate, a semiconductor layer, comprising polycrystalline silicon, having a drain region, an active gate region, and a source region, disposed on said substrate, a drain terminal connected to said drain region, and a source terminal connected to said source region, both for external connection, and a first gate electrode asymmetrically positioned with respect to and coupled with a part of said active gate region through a dielectric layer, wherein the length of said gate electrode proximate to said active gate region is shorter than the length of said active gate region juxtaposed thereto whereby forming a region, having a length longer than about 5,000 Å and shorter than about 1.5 µm, which is offset with respect to that portion of said active gate region which is not juxtaposed to said gate electrode; and wherein said offset region is provided in the portion of said active gate region directed toward said drain region, and no offset region is provided in the portion of said active gate region directed toward said source region.

6. A thin film transistor according to claim 5 further comprising a second gate electrode sandwiching said active gate region between it and said gate electrode, and provided that the length of said second gate electrode parallel to said active gate region is substantially the same as the length of said active gate region.

* * * * *